United States Patent
Albrecht et al.

(10) Patent No.: US 7,570,682 B2
(45) Date of Patent: Aug. 4, 2009

(54) VCSEL PUMPED IN A MONOLITHICALLY OPTICAL MANNER AND COMPRISING A LATERALLY APPLIED EDGE EMITTER

(75) Inventors: Tony Albrecht, Bad Abbach (DE); Peter Brick, Regensburg (DE); Stephan Lutgen, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/579,528

(22) PCT Filed: Nov. 9, 2004

(86) PCT No.: PCT/DE2004/002477

§ 371 (c)(1),
(2), (4) Date: Feb. 27, 2007

(87) PCT Pub. No.: WO2005/048424

PCT Pub. Date: May 26, 2005

(65) Prior Publication Data

US 2007/0217463 A1    Sep. 20, 2007

(30) Foreign Application Priority Data

Nov. 13, 2003   (DE)   ................................ 103 53 216

(51) Int. Cl.
*H01S 5/00* (2006.01)
*H01S 3/091* (2006.01)
(52) U.S. Cl. .................................. 372/50.124; 372/69
(58) Field of Classification Search .............. 372/50.1, 372/50.124, 75, 69–72
See application file for complete search history.

(56) References Cited

U.S. PATENT DOCUMENTS

| | | | | |
|---|---|---|---|---|
| 5,719,891 A | * | 2/1998 | Jewell | 372/46.013 |
| 6,252,896 B1 | * | 6/2001 | Tan et al. | 372/50.11 |
| 6,370,168 B1 | * | 4/2002 | Spinelli | 372/22 |

(Continued)

FOREIGN PATENT DOCUMENTS

DE    101 29 616 A1    1/2003

(Continued)

OTHER PUBLICATIONS

Michael D. Gerhold, et al., "Novel Design of a Hybrid-Cavity Surface Emitting Laser", IEEE Journal of Quantum Electronics, vol. 34, No. 3, pp. 506-511, Mar. 1998.

*Primary Examiner*—Minsun Harvey
*Assistant Examiner*—Phillip Nguyen
(74) *Attorney, Agent, or Firm*—Cohen Pontani Lieberman & Pavane LLP (57) ABSTRACT

A semiconductor laser device comprising an optically pumped surface-emitting vertical emitter region (2) which has an active radiation-emitting vertical emitter layer (3) and has at least one monolithically integrated pump radiation source (5) for optically pumping the vertical emitter region (2), which has an active radiation-emitting pump layer (6). The pump layer (6) follows the vertical emitter layer (3) in the vertical direction and a conductive layer (13) is provided between the vertical emitter layer (3) and the pump layer (6). Furthermore, a contact (9) is applied on the side of the semiconductor laser device which is closer to the pump layer (6) than to the conductive layer (13). An electrical field can be applied between this contact (9) and the conductive layer (13) for generating pump radiation (7) by charge carrier injection.

16 Claims, 6 Drawing Sheets

U.S. PATENT DOCUMENTS

| | | | |
|---|---|---|---|
| 6,434,180 B1 * | 8/2002 | Cunningham | 372/50.1 |
| 6,954,479 B2 | 10/2005 | Albrecht et al. | |
| 2002/0054618 A1 * | 5/2002 | Jiang et al. | 372/50 |
| 2002/0075929 A1 * | 6/2002 | Cunningham | 372/50 |
| 2002/0146053 A1 * | 10/2002 | Iwai | 372/75 |
| 2003/0007538 A1 * | 1/2003 | Jiang et al. | 372/75 |
| 2003/0067009 A1 * | 4/2003 | Chua et al. | 257/84 |

FOREIGN PATENT DOCUMENTS

| | | |
|---|---|---|
| DE | 102 14 120 A1 | 10/2003 |
| JP | 2003 283051 A | 10/2003 |
| WO | WO 01/93386 A1 | 12/2001 |
| WO | WO 03/094311 A | 11/2003 |

* cited by examiner

VCSEL PUMPED IN A MONOLITHICALLY OPTICAL MANNER AND COMPRISING A LATERALLY APPLIED EDGE EMITTER

RELATED APPLICATIONS

This is a U.S. national stage of application No. PCT/DE2004/002477, filed on 9 Nov. 2004.

This patent application claims the priority of German patent application no. 103 53 216.1 filed Nov. 13, 2003, the disclosure content of which is hereby incorporated by reference.

FIELD OF THE INVENTION

The invention relates to a semiconductor laser device comprising an optically pumped surface-emitting vertical emitter region which has an active radiation-emitting vertical emitter layer, and at least one monolithically integrated pump radiation source for optically pumping the vertical emitter region, which has an active radiation-emitting pump layer.

BACKGROUND OF THE INVENTION

Such a laser device and a production method therefore is known from U.S. Pat. No. 6,954,479, the content of which is incorporated herewith in the present description by reference. An optically pumped surface-emitting semiconductor laser device comprising an amplifier region as vertical emitter region and at least one edge-emitting semiconductor laser as pump radiation source is described. The vertical emitter region and the pump radiation source are grown epitaxially on a common substrate. This makes it possible to achieve a space-saving monolithically integrated arrangement of vertical emitter region and pump radiation sources.

A high pumping efficiency, and thus a high output power of the vertical emitter, is achieved if the wavelength of the pump radiation source is shorter than the wavelength of the radiation emitted by the vertical emitter. This can be achieved, for example, by means of different compositions of the materials of the radiation-emitting pump or vertical emitter layer or by different dimensioning of these layers.

A typical production approach for such a semiconductor laser device is to epitaxially grow the layers for the vertical emitter region initially over a large area on a substrate. Subsequently, these layers are selectively etched away again in the lateral regions which are provided for the pump radiation sources. In a second step of epitaxy, the layers of the pump radiation sources are then finally grown epitaxially in these regions.

Such a two-step epitaxial process is disadvantageous for a number of reasons. In the transition region between pump radiation sources and vertical emitter region, it is difficult to avoid grain boundaries and an increased density of defects which leads to optical absorption losses at this point. Furthermore, the edge of the vertical emitter region can influence the growth mode of the layers of the pump radiation sources in the transition region which can result in a disadvantageous deviation of the layer thicknesses in this transition region. In addition, the two-step epitaxial process is associated with high production expenditure.

From Gerhold et al., IEEE Journal of Quantum Electronics, Volume 34, No. 3, 1998, pages 506-511, an optically pumped semiconductor laser device produced in a one-step epitaxy is known. Vertical emitter region and pump radiation sources have a common active layer with a quantum well structure. In the region used as pump radiation source, the quantum well structure is intermixed with impurity atoms which leads to the generation of radiation having a shorter wavelength in this region than in the vertical emitter region (IILD—impurity induced layer disordering). However, the method of intermixing with impurity atoms only allows small variations of the wavelength and is also accompanied by the risk that the effectiveness of the radiation emission and thus the pump efficiency will drop.

A general problem with optically pumped semiconductor laser devices which are produced in a one-step epitaxy is represented by the fact that the layer structure of vertical emitter region and pump radiation sources is initially identical. Ideally, in operation, a radiation field expanding laterally should only be generated in the area of the pump radiation sources and in the vertical emitter region only a radiation field expanding in the vertical direction should be generated. Vertically propagating modes in the region of the pump radiation sources reduce the pump radiation power generated. Analogously, laterally expanding radiation modes generated in the vertical emitter region reduce the population inversion and thus the pump efficiency. An efficiently operating semiconductor laser device of said type thus presupposes that the balance between pump layer and vertical emitter layer is cancelled, i.e. that pump layer and vertical emitter layer are no longer equivalent.

SUMMARY OF THE INVENTION

It is an object of the present invention, therefore, to create an optically pumped semiconductor laser device which has high pumping efficiency and can be produced in a one-step epitaxial process.

This and other objects are attained in accordance with one aspect of the present invention directed to a semiconductor laser device comprising an optically pumped surface-emitting vertical emitter region which has an active radiation-emitting vertical emitter layer, and at least one monolithically integrated pump radiation source for optically pumping the vertical emitter, which has an active radiation-emitting pump layer. The pump layer follows the vertical emitter layer in the vertical direction, and a conductive layer is provided between the vertical emitter layer and the pump layer. Furthermore, a contact is applied on the side of the semiconductor laser device which is closer to the pump layer than to the conductive layer. An electrical field can be applied between this contact and the conductive layer for generating pump radiation by charge carrier injection.

The vertical emitter layer and the pump layer are layers which are vertically separated from one another and have been grown in succession. This structure ensures great freedom with respect to the choice of materials and dimensioning for these layers. As a result, the wavelength of the pump radiation and of the vertically emitted radiation can be adjusted within wide limits as a result of which high pumping efficiency can be achieved. The arrangement according to the invention of the conductive layer and of the contact on the side of the semiconductor laser device leads to charge carriers being selectively injected into the pump layer and not into the vertical emitter layer by an electrical field applied between this conductive layer and the contact. The excitation of parasitic laterally propagating radiation is thus prevented in the vertical emitter layer.

The semiconductor laser device is preferably partially ablated so that the conductive layer is partially exposed. In one embodiment of the invention, the semiconductor laser device can be ablated in the form of parallel trenches. It is particularly preferred if a further contact for contacting this conductive layer is applied to the exposed regions of the conductive layer. In another embodiment of the invention, a layer which is electrically conductive and which is transparent for radiation of a wavelength as generated by the pump radiation source is provided between the conductive layer and the further contact.

To produce the semiconductor laser device according to the invention, a single epitaxial process is sufficient. Even if layers are partially ablated again as in the embodiments described above, and further layers or contacts are applied, this can be performed without a technologically elaborate second epitaxial step.

In a further embodiment, an etch stop layer which is resistant to an etching process which is suitable for exposing the conductive layer is provided adjacently to the conductive layer in order to be able to end the ablation of the semiconductor laser device in a controlled manner.

It is advantageous to arrange the conductive layer vertically in such a manner that it is located in a node of the standing-wave field in the resonator of the vertical emitter. This minimizes optical losses in the vertical emitter region due to the conductive layer.

In a preferred embodiment of the invention, a vertical waveguide structure is provided between the vertical emitter layer and the conductive layer. It is preferred that the vertical waveguide structure has other optical characteristics in the region in which it is located between the contact and the further contact, seen laterally, than in the region in which it is not located between the contact and the further contact.

The vertical emitter layer and the pump layer follow one another in the vertical direction. The main direction of radiation of the pump radiation is lateral. In order that the pump radiation reaches the vertical emitter layer at all for the optical pumping, there must be a region in which the pump radiation can also propagate in the vertical direction. This purpose is served by the vertical waveguide structure. In this arrangement, it is desirable that a vertical propagation of the pump radiation is well formed in the vertical emitter region whereas it should be suppressed if possible in the region of the pump radiation sources. According to the invention, this is achieved by the fact that the vertical waveguide structure has different optical characteristics in the region of the pump radiation sources, that is to say between the contact and the further contact, than in the vertical emitter region, that is to say in the region in which it is not between the contact and the further contact.

In an advantageous development of the invention, a difference in the optical characteristics is achieved by the fact that the vertical waveguide structure is oxidized in the region in which it is located between the contact and the further contact, seen laterally.

In an advantageous embodiment of the invention, the pump layer and the vertical emitter layer are followed in the vertical direction by an internal cavity reflective structure which is a Bragg reflector in a particularly preferred manner. In a development of the invention, the internal cavity reflective structure is arranged between the vertical emitter layer and a substrate and the radiation generated by the vertical emitter layer is launched on the side opposite the substrate.

In a further embodiment of the invention, the vertical emitter layer is associated with an external reflector which, together with the internal cavity reflective structure, forms the resonator for the vertical emitter region. In a preferred embodiment of the invention, beam-shaping elements or frequency-selective elements or frequency-converting elements are arranged in the resonator.

In advantageous development of the invention the vertical emitter layer and/or the pump layer in each case have one or more quantum well structures, the term quantum well structure, in the context of the application, comprising any structure in which charge carriers are subjected to a quantization of their energy states by confinement. In particular, the term quantum well structure does not contain any information about the dimensionality of the quantization. Among other things, it comprises quantum troughs, quantum wires and quantum dots and any combination of these structures.

DETAILED DESCRIPTION OF THE DRAWINGS

Identical or identically acting elements are provided with the same reference symbols in the Figures. The Figures are diagrammatic drawings. In particular, the ratios of dimensions of the elements are not shown true to scale.

Figure 1:
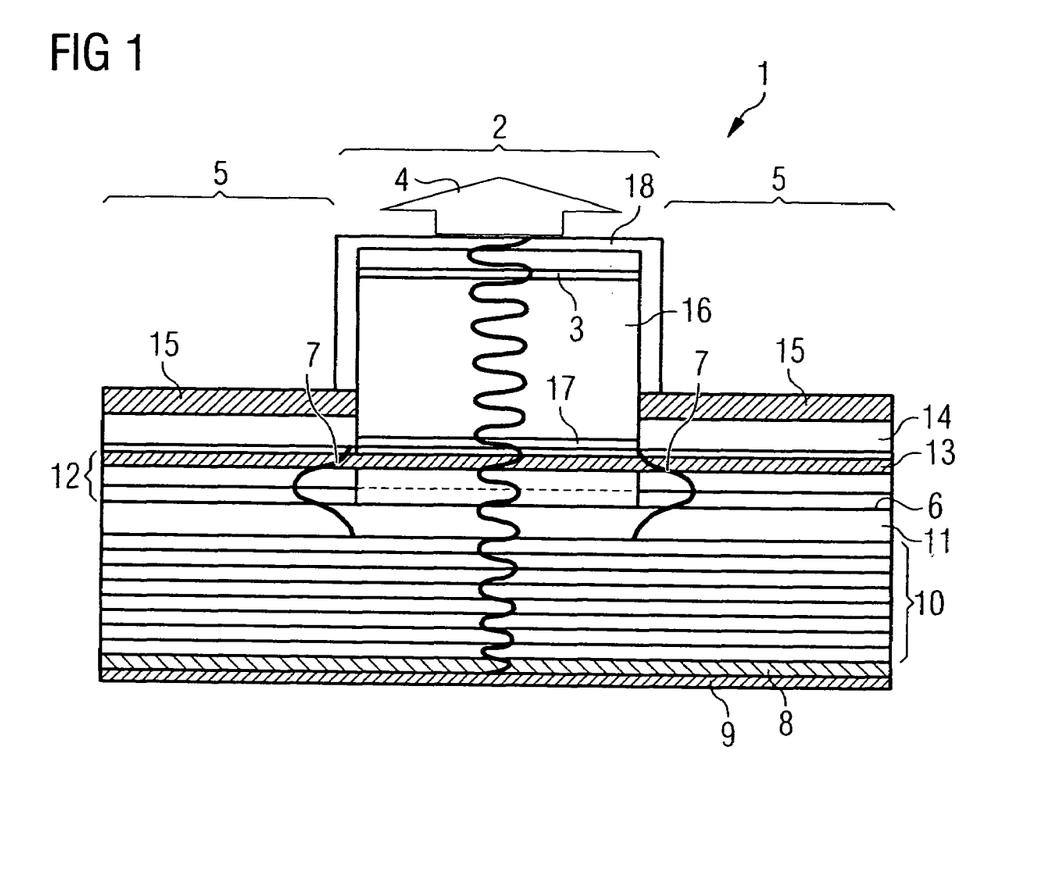
FIG. 1 shows a diagrammatic sectional view of a first exemplary embodiment of a semiconductor laser device according to the invention.

FIG. 1 shows a first exemplary embodiment of a semiconductor laser device according to the invention. In a semiconductor body 1, a vertical emitter region 2 is arranged vertically. The vertical emitter region 2 has as an active element a vertical emitter layer 3 for generating a radiation field 4. The radiation field 4 is shown diagrammatically as wave train within the semiconductor body 1. Laterally adjacently to the vertical emitter region 2, pump radiation sources 5 are arranged. They have a pump layer 6 for generating a pump radiation 7 for optically pumping the vertical emitter layer 3.

The pump radiation 7 is diagrammatically indicated by its gaussian intensity profile perpendicularly to the pump layer 6.

The vertical emitter region 2 and the pump radiation sources 5 are jointly grown epitaxially on a substrate 8 which is provided with a contact 9 on one side. On the side of the substrate 8 facing away from the contact 9, a Bragg reflector structure 10 is applied, followed by a cladding layer 11. The cladding layer 11 is followed on the side facing away from the substrate 8 by a pump waveguide 12 which contains the pump layer 6 as central element. The pump waveguide 12 is bounded on the side facing away from the substrate 8 by a conductive layer 13 to which a conductive and transparent layer 14 is applied in the region of the pump radiation sources 5. The conductive and transparent layer 14 is provided with a further contact 15 on the side facing away from the substrate 8.

Within the vertical emitter region 2, the semiconductor laser device has a vertical waveguide structure 16 which vertically follows the conductive layer 13 on the side facing away from substrate 8, the vertical structure 16 contains an etch stop layer 17 and the vertical emitter layer 3. In addition, a window 18 is provided which bounds the vertical emitter region 2 on the side facing away from the substrate 8 and through which the radiation field 4 can leave the semiconductor body 1.

Suitable systems of materials for implementing the invention can be found in the group of III-V compound semiconductors. The exemplary embodiment shown can be implemented, for example, on the basis of $(Al_xIn_{1-x})_yGa_{1-y}As_zP_{1-z}$ with $0 \leq x \leq 1$, $0 \leq y \leq 1$, $0 \leq z \leq 1$. Other possible systems of materials are based on GaN or InP depending on the wavelength required.

Naturally, however, the invention is not restricted to this system of materials but can also be constructed on a basis of another system of materials depending on the wavelength required or other requirements.

The pump radiation sources 5 are constructed as edge-emitting electrically pumped semiconductor lasers, the main direction of radiation of which points to the vertical emitter region 2. The end faces of the pump radiation sources 5 located in parallel to one another and facing away from the vertical emitter region 2 are constructed to reflect and are used as cavity reflectors for the pump radiation 7. These end faces can be advantageously generated by splitting or by etching and can be optionally metallized in a highly reflective manner. In the exemplary embodiment shown, both pump radiation sources 5 form a single, coherent oscillating laser.

The pump layer 6 can be implemented, for example, by a single quantum well (SQW) or by a sequence of layers of a number of quantum wells (MQW, multiple quantum wells). The quantum well or wells are typically embedded in barrier layers which form the pump waveguide 12.

To operate the semiconductor laser device, charge carriers are injected into the semiconductor body 1 via the contact 9 and the further contact 15 and are radiantly recombined in the pump layer 6, building up the pump radiation 7. To achieve adequate current conductivity, all current-conducting layers of the semiconductor body 1 must be adequately doped. However, conductive layers adjoining the pump waveguide 12 directly lead to significantly high optical losses due to radiation absorption at free charge carriers.

The layers of the Bragg reflector structure 10 adjoining the pump waveguide 12 directly must advantageously be doped less for this reason. As an alternative, it is possible to apply a less highly doped cladding layer 11 to the doped Bragg reflector structure 10 as is shown in the exemplary embodiment in FIG. 1.

On the opposite side of the pump waveguide 12, the further contact 15 is not applied directly to the pump waveguide 12 for the same reason. The conductive and transparent layer 14 additionally inserted here is ideally conductive for electrical current, as a result of which it meets the requirements for good current impression, and is at the same time transparent to the pump radiation 7 which minimizes optical losses. A possible material for such a layer is represented by, for example, indium tin oxide (ITO) or a zinc oxide containing compound.

The conductive layer 13 arranged between the pump waveguide 12 and the conductive and transparent layer 14 is used for lateral current distribution and widens the pumped region of the pump radiation sources 5 into the vertical emitter 2. To keep optical losses on the conductive layer 13 low, it is constructed to be comparatively thin.

The pump waveguide 12 and the conductive layer 13, respectively, are adjoined by different layers in the vertical emitter region 2 and in the regions of the pump radiation sources 5 (etch stop layer 17 and vertical waveguide structure 16 adjoin the vertical emitter region 2 and the conductive and transparent layer 14 adjoins the pump radiation sources 5). This results in an effective difference in the index of refraction of the pump waveguide 12 within these different regions. The pump radiation 7 is thus diffracted at the transition from the pump radiation sources 5 into the vertical emitter region 2. As a result, the pump radiation 7 propagates in the vertical emitter region 2 in the form of a vertical pump mode by means of which the vertical emitter layer 3 is optically pumped. This mechanism will be shown in further detail below in conjunction with FIGS. 9 and 10.

Like the pump layer 6, the vertical emitter layer 3 can also be formed by a single quantum well structure or by an arrangement of a number of quantum well structures. The charge carriers released by the pump mode in the vertical emitter layer 3 or in immediately adjoining layers radiantly recombine in the vertical emitter layer 3. An absorption of the pump mode in the quantum well structure or structures and not in the immediately adjoining layers is more suitable for achieving a good beam quality and is therefore preferred.

A resonator formed from the Bragg reflector structure 10 and an external reflector, not shown here, forms the radiation field 4. A high pumping efficiency can be achieved by selecting the wavelength of the pump radiation 7 to be shorter than the wavelength of the radiation field 4.

To minimize absorption losses in the radiation field due to the conductive layer 13, it is advantageous to position the conductive layer 13 in a node, that is to say an intensity minimum, of the radiation field in the resonator of the vertical emitter region.

All semiconductor layers in the exemplary embodiment shown can be produced in one epitaxial process. Following this, the regions of the pump radiation sources 5 are laterally selectively ablated down to the conductive layer 13. This is preferably done by means of an etching process. To expose the conductive layer 13 in a defined manner with the aid of the etching process, the etch stop layer 17, which is resistant to the etching process used, is provided directly adjacently to the conductive layer. After the etching process, the etch stop layer 17 in turn is removed by a suitable process. Following this in the production process, the conductive and transparent layer 14 and the further contact 15 are applied to the conductive layer 13 exposed in this manner. These noncrystalline layers are not subjected to a rigidly controlled epitaxial growth process and can be vapour-deposited in a simple manner.

Figure 2:
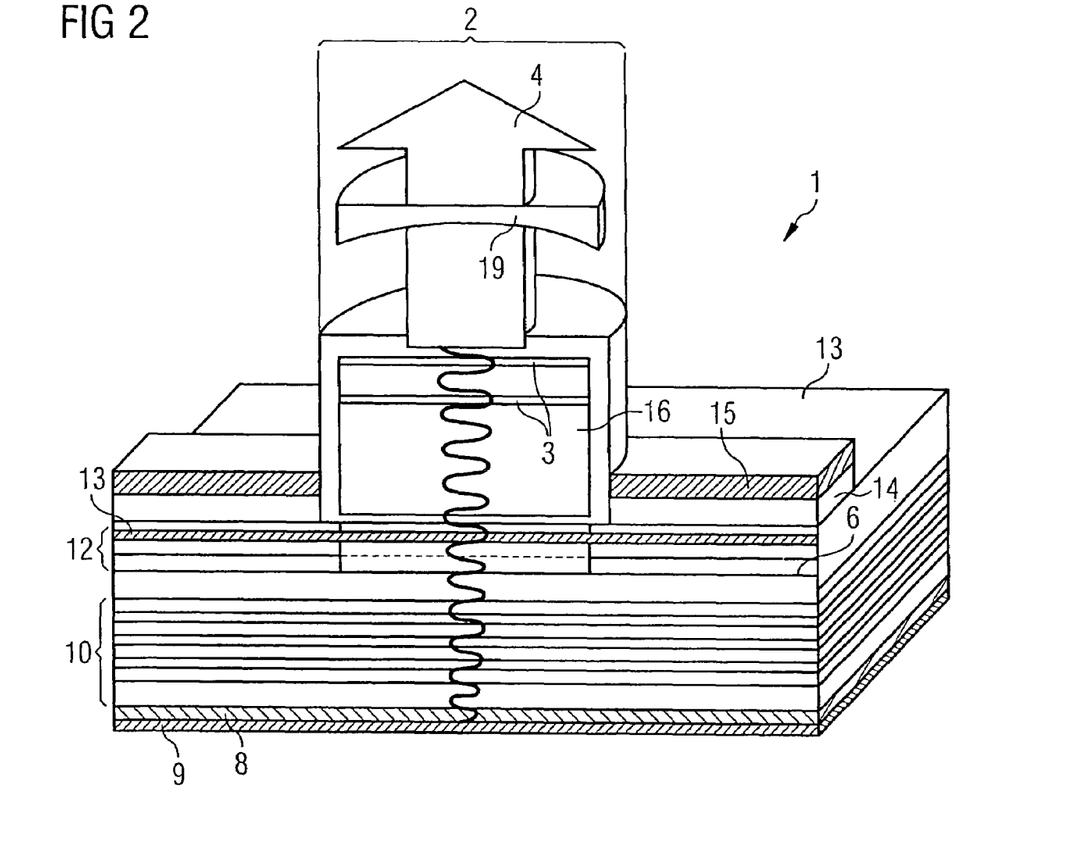
FIG. 2 shows a three-dimensional diagrammatic sectional view of the first exemplary embodiment.

FIG. 2 shows a three-dimensional sectional drawing of the first exemplary embodiment, explained above, of the semiconductor laser device according to the invention.

In addition to the semiconductor body 1, an external resonator reflector 19 is drawn in this Figure. The external resonator reflector 19 is constructed as a semitransparent reflector which launches laser radiation of the vertical emitter region 2 out of the radiation field 4. The reflector is curved on the resonator side for stabilizing the internal radiation modes of the resonator.

In FIG. 2, the perspective view shows that the semiconductor body 1 is ablated down to the conductive layer 13 with the exception of the vertical emitter region 2. Since it does not meet the requirements of high pumping efficiency to design the pump radiation sources 5 to be wider than the diameter of the vertical emitter region 2, the conductive and transparent layer 14 and the applied contact 15 are applied to the conductive layer 13 in the form of strips as shown.

Figure 3:
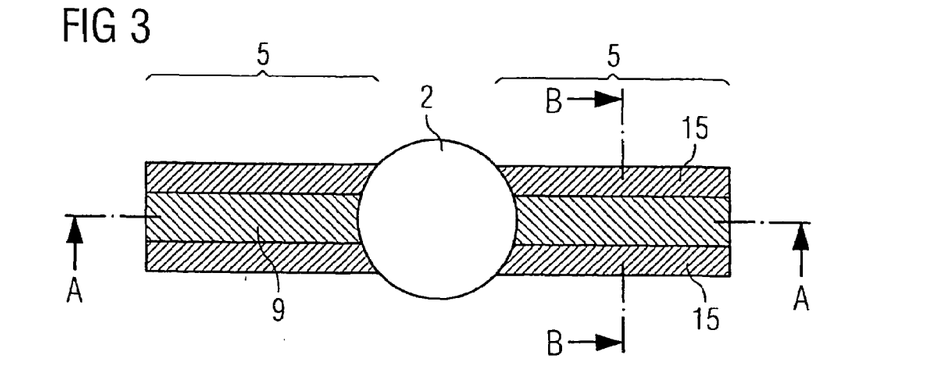
FIG. 3 shows a diagrammatic top view of a second exemplary embodiment of a semiconductor laser device according to the invention.

FIG. 3 shows the diagrammatic top view of a second exemplary embodiment of the semiconductor laser device. In this example, two pump radiation sources 5 are arranged adjacently to a central vertical emitter region 2. In this exemplary embodiment, however, the contact 9 is not provided on the rear of the substrate 8 but on the side of the semiconductor laser device facing away from the substrate.

Figure 4:
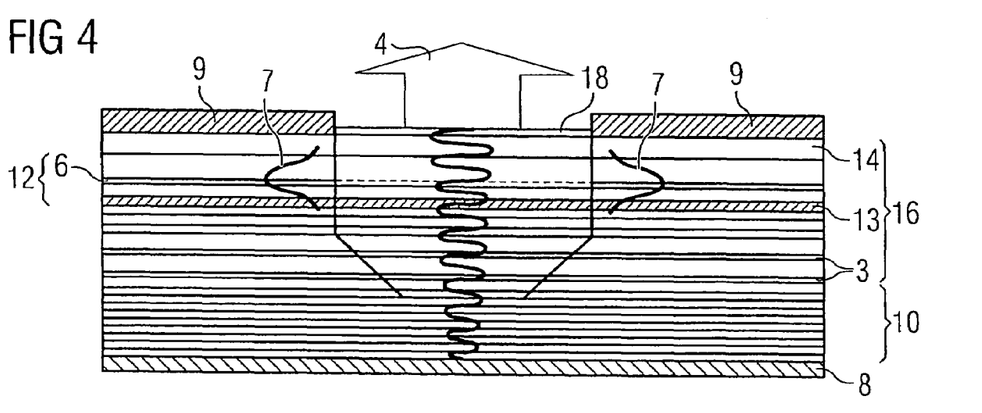
FIG. 4 shows a diagrammatic sectional view of the second exemplary embodiment along the section line AA shown in FIG. 3.

FIG. 4 shows a diagrammatic sectional representation of this exemplary embodiment along the section line AA of FIG. 3. Compared with the first exemplary embodiment, the arrangement of the layers mainly differs in that the vertical emitter layer 3 is here closer to the Bragg reflector structure 10 than the pump layer 6.

In this exemplary embodiment, two measures are used for cancelling the balance between pump layer 6 and vertical emitter layer 3.

On the one hand, charge carriers are only injected into the pump layer 6 but not into the vertical emitter layer 3, as is also the case in the first exemplary embodiment. This is achieved by the semiconductor laser device being contacted via the contact 9 and via the further contact 15 which is laterally connected to the conductive layer 13. The contact 9 and the conductive layer 13 thus enclose the pump layer 6 whereas the vertical emitter layer 3 is free of static electrical fields.

The second measure consists in providing a better vertical waveguide for the pump radiation in the vertical emitter region 2 than in the region of the pump radiation sources 5. For this purpose, a part of the vertical waveguide structure 16 is constructed as periodic waveguide layer structure 20 shown in FIG. 5 which is a sectional view taken along line BB in FIG. 3 (RPG—resonant periodic gain). In a semiconductor laser device based on the system of materials AlInGaAsP, the periodic waveguide layer structure 20 can have, for example, AlGaAs layers with high aluminum content. Such layers with high aluminum content can be oxidized through from the side of the semiconductor body 1 in a defined manner to the transition region between pump laser structures 5 and vertical emitter region 2 by a wet-chemical oxidation method as a result of which the index of refraction can be changed by up to about 50% in the oxidized region.

Figure 5:
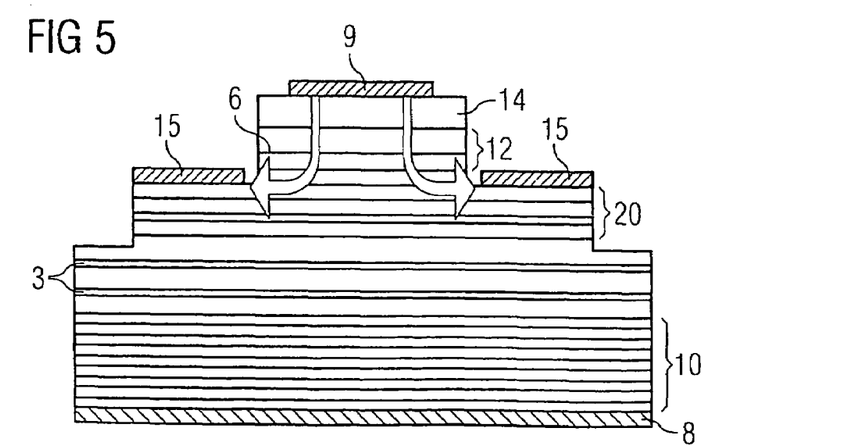
FIG. 5 shows a diagrammatic sectional view of the second exemplary embodiment along the section line BB shown in FIG. 3.

The oxidized part of the periodic waveguide layer structure 20 no longer meets any resonance conditions for the pump radiation 7 which is why it does not represent a good waveguide in the vertical direction in this region. Naturally, the measure of subsequently changing the vertical waveguidance in the region of the pump radiation sources, e.g. by oxidation, is not restricted to the periodic waveguide layer structure 20 but can be extended similarly to the entire vertical waveguide structure 16 or any parts thereof within the context of the invention.

As mentioned above, FIG. 5 shows a diagrammatic sectional view of the second exemplary embodiment along line BB.

This representation shows that the waveguide laser device is ablated down to the conductive layer 13 on both sides of the pump region. Directly adjacently to the conductive layer 13 an etch stop layer 17 is again provided in order to implement the ablation by an etching process which can be stopped in a defined manner. On both sides of the exposed conductive layer 13, the further contact 15 is applied in the form of contact strips. The current paths 21 drawn in illustrate the current flow within the pump radiation sources 5.

In a second etching process, the semiconductor laser device is ablated in the outer region to such an extent that the edges of the periodic waveguide layer structure 20 are also accessible in the wafer compound of the wet chemical oxidation.

Analogously to FIGS. 3, 4 and 5, FIGS. 6, 7 and 8 show the diagrammatic top view and two diagrammatic sectional views of a third exemplary embodiment of the semiconductor laser device according to the invention.

Figure 6:
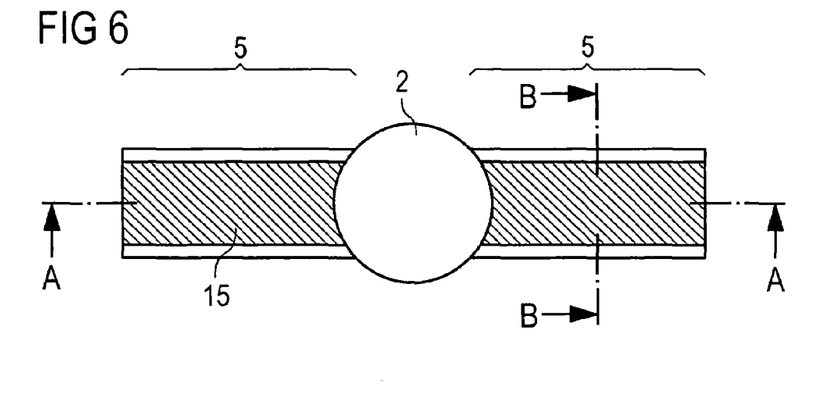
FIG. 6 shows a diagrammatic top view of a third exemplary embodiment of a semiconductor laser device according to the invention.
Figure 7:
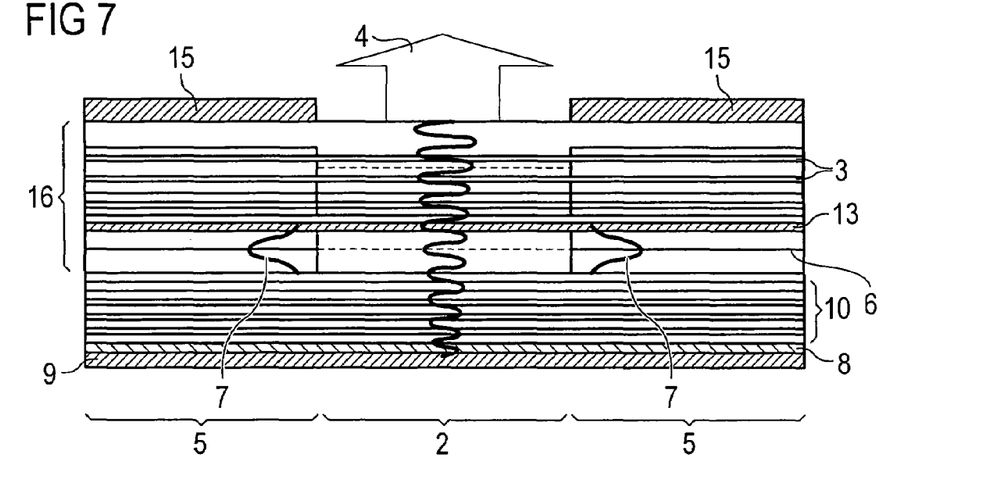
FIG. 7 shows a diagrammatic sectional view of the third exemplary embodiment along the section line AA drawn in FIG. 6.
Figure 8:
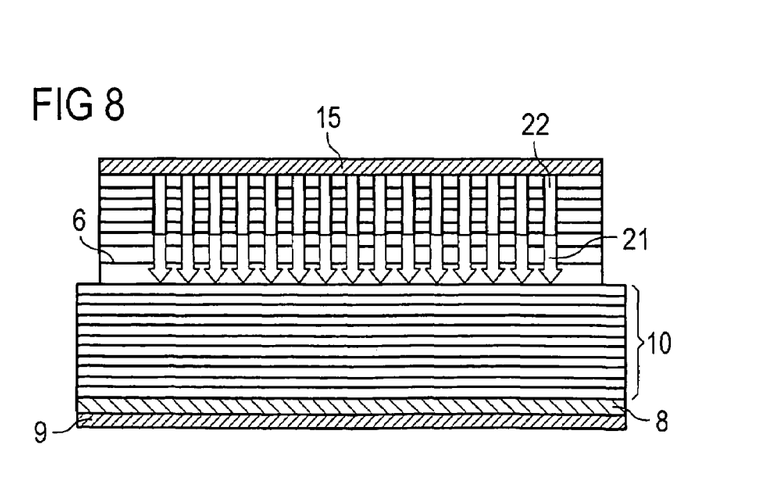
FIG. 8 shows a diagrammatic sectional view of the third exemplary embodiment along the section line BB drawn in FIG. 6

Two measures for cancelling the balance between vertical emitter layer 3 and pump layer 6 are again used. In this exemplary embodiment, the entire layer sequence of the semiconductor laser device is arranged between the two contacts 9 and 15. The arrangement of the layers essentially corresponds to the first exemplary embodiment shown (pump layer 6 closer to the Bragg reflector structure 10 than the vertical emitter layer 3), the periodic waveguide layer structure 20 again being arranged between the pump layer 6 and the vertical emitter layer 3.

In contrast to the first exemplary embodiment, the semiconductor laser structure is not ablated in a plane in the area of the pump radiation sources 5 in this case but in the form of narrow parallel trenches 22 as can be seen from FIG. 8. These trenches 22 are etched into the semiconductor body 1 to the depth of an etch stop layer 17 again directly adjacent to the conductive layer 13.

In the area of the pump radiation sources 5, these trenches thus also cut through the periodic waveguide layer structure 20. These trenches can thus be advantageously used for wet-chemical oxidation of the periodic waveguide layer structure 20. As an alternative or in addition, wider trenches can be provided for oxidation in the outer region of the semiconductor laser device as already described in the second exemplary embodiment. After the periodic waveguide layer structure 20 has been oxidized, the trenches 22 are filled with conductive material before the contact 15 is applied. In an advantageous embodiment, a conductive and transparent material is used as conductive material either over the entire depth of the trenches 22 or else only in the lower region adjoining the conductive layer 13. The material used is again ITO or a zinc oxide containing compound here.

Figure 9:
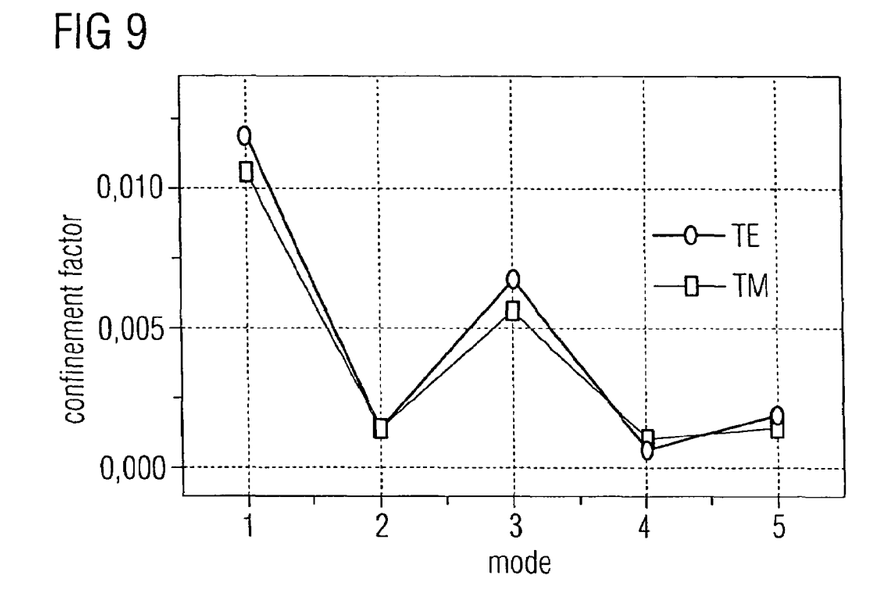
FIG. 9 shows a graphical representation of the overlap of pump mode and vertical emitter mode in the vertical emitter region.

FIG. 9 graphically shows the overlap of the pump radiation 7 with various radiation modes of the vertical emitter region 2. The overlap is specified as dimensionless confinement factor for the first five transverse electric (TE) and transverse magnetic (TM) modes of the vertical emitter region 2. The data shown are results of investigations with respect to the exemplary embodiment shown in FIG. 1.

A good overlap is obtained for the first fundamental TE/TM mode which is thus preferably amplified in the resonator and emitted by the semiconductor laser arrangement. The result shows that, according to the invention, a semiconductor laser device having almost perfect $TEM_{00}$ beam quality can be achieved.

Figure 10:
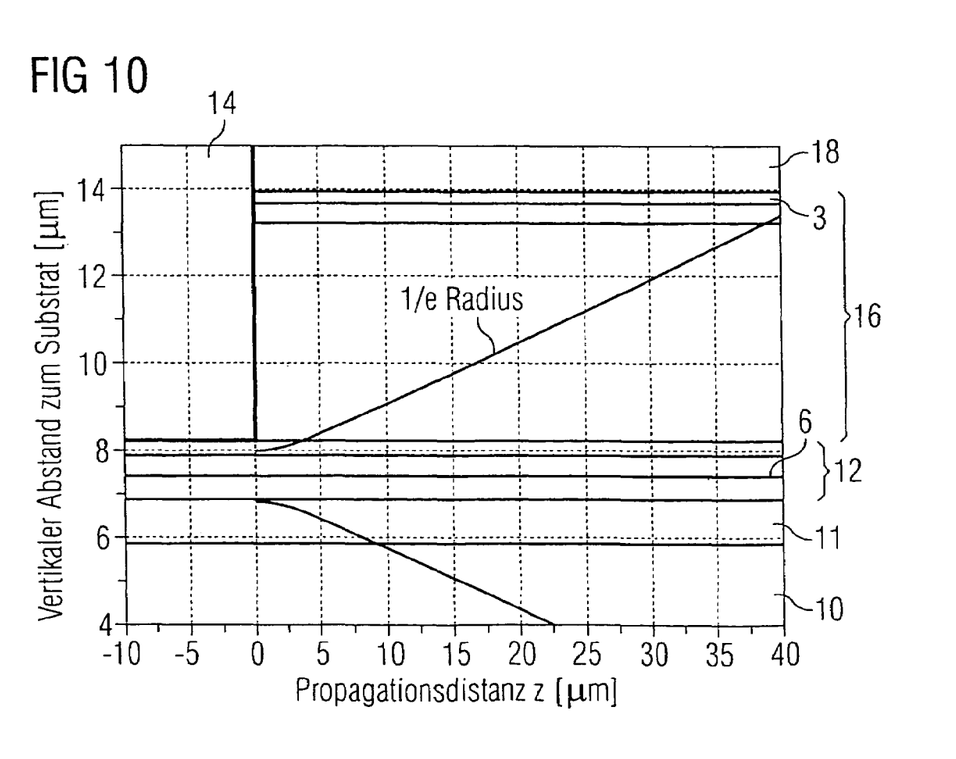
FIG. 10 shows a graphical representation of the propagation of the pump radiation in the vertical direction in the vertical emitter region.

FIG. 10 graphically shows how the pump radiation 7 propagates in a vertical direction on transition from the pump radiation sources 5 into the vertical emitter region 2. The point curve is plotted at which the pump radiation field has dropped to the factor 1/e of its original value. The vertical distance from the substrate is specified in micrometers along the ordinate and the distance passed by the radiation in the lateral direction into the vertical emitter region 2 is specified along the abscissa. To provide better orientation, the various layers of the semiconductor laser device are entered as horizontal lines in the diagram and provided with reference symbols. It is found that the intensity of the pump mode is about 1/e (37%) of its maximum intensity after only 40 µm after exit from the pump radiation source. The pump radiation intensity at the vertical emitter layer 3 thus rises in the direction of the centre of the vertical emitter region 2 which explains the large overlap of the pump mode with the fundamental $TEM_{00}$ mode of the vertical emitter region 2.

Figure 11:
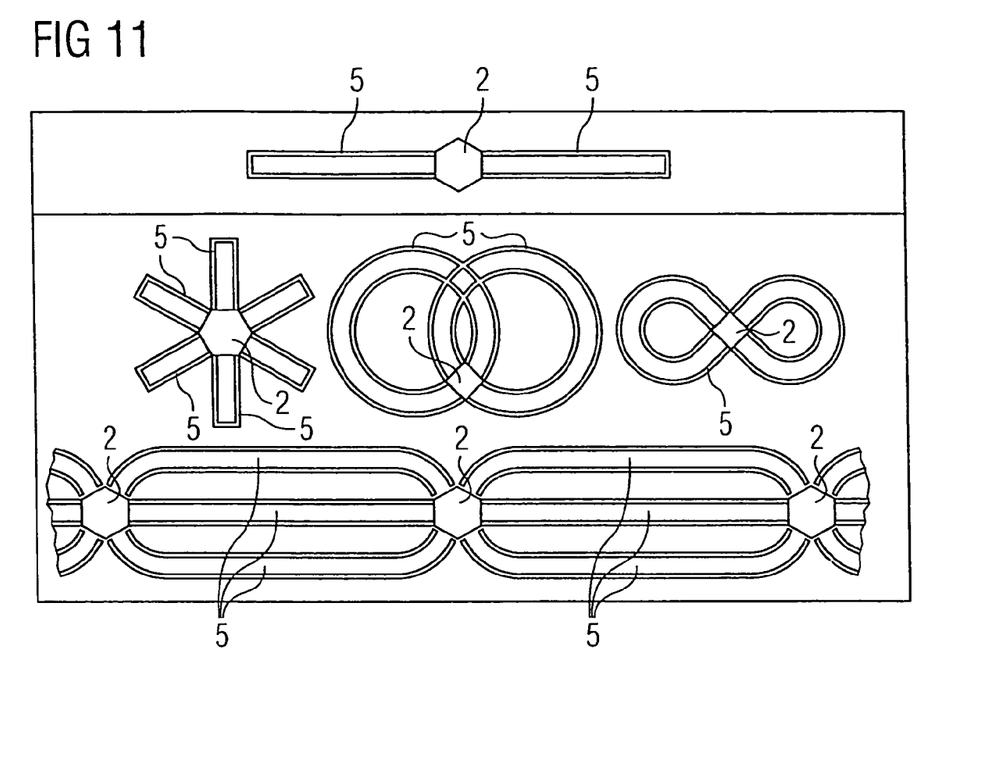
FIG. 11 shows a diagrammatic top view of various exemplary embodiments of a semiconductor laser device according to the invention to illustrate a possible arrangement of pump radiation source and vertical emitter region.

FIG. 11 shows a top view of various embodiments of the semiconductor laser device according to the invention.

The fact that the semiconductor laser device according to the invention can be produced in a one-step epitaxial process opens up the possibility of implementing the most varied and complex arrangements of the vertical emitter region 2 and pump radiation sources 5 with respect to one another in a relatively simple manner. Some conceivable possibilities are shown in FIG. 11.

At the top in the Figure, an arrangement similar to the embodiments that have been so far described, with two linear pump radiation sources 5 which are opposite one another and are laterally adjacent to a central vertical emitter region 2 which is hexagonal here, is shown. At the centre on the left in FIG. 11, a similar arrangement is shown in which six pump radiation sources 5 are in each case opposite one another in pairs. In the centre of FIG. 11, an arrangement is shown in which the vertical emitter region 2 is designed to be square and in which two pump radiation sources 5 constructed as ring lasers are provided which overlap in such a manner that they intersect in the vertical emitter region 2. Similar to this is the arrangement shown on the right in which a ring laser 5 is present which is wound to form an "8", at the point of intersection of which the vertical emitter region 2 is again arranged. The ring laser structures specified which are based on wave guidance have the advantage that cavity end reflectors can be omitted and there are no losses on these cavity end reflectors. At the bottom in FIG. 11 an arrangement is shown in which a number of hexagonal vertical emitter regions 2 located in a row are provided which are pumped by various linear or also curved pump radiation sources 5.

Figure 12:
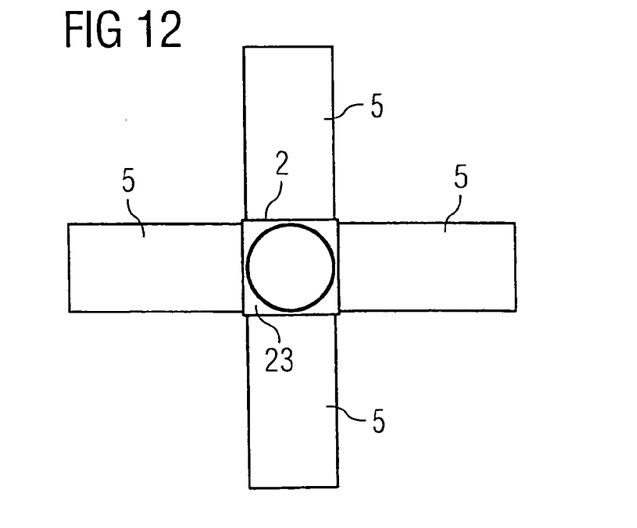
FIG. 12 shows a diagrammatic top view of a further exemplary embodiment of the semiconductor laser device according to the invention to represent a further possible arrangement of pump radiation source and vertical emitter region.

FIG. 12 diagrammatically shows the top view of another exemplary embodiment of the semiconductor laser device according to the invention in which four pump radiation sources 5 pump a square vertical emitter region 2.

FIG. 12 illustrates a measure for achieving a beam profile which is as radially symmetric as possible even with a vertical emitter region 2 which is not round and in this case is square. Vertical emitter regions 2 which are not round are obtained, for example, almost unavoidably in the exemplary embodiment shown in FIG. 11 in which a pump radiation source 5 constructed as ring laser intersects itself in a vertical emitter region 2. In this measure, the vertical emitter layer 3 is changed, e.g. by ion beam bombardment, in an outer region 23 of the vertical emitter region 2, in such a manner that it absorbs the pump light of the pump radiation sources 5 with a lesser efficiency in this region than in the inner region which is not changed and is as circular as possible.

The explanations of the invention by means of the exemplary embodiments are not intended to be understood as a restriction of the invention to these. Instead, the invention also includes the combination of all features mentioned in the exemplary embodiments or the claims or the description even if this combination is not explicitly the subject matter of a claim.

The invention claimed is:

1. A semiconductor laser device comprising:
   an optically pumped surface-emitting vertical emitter region which has an active radiation-emitting vertical emitter layer;
   at least one monolithically integrated pump radiation source for optically pumping the vertical emitter, which has an active radiation-emitting pump layer, wherein the pump layer follows the vertical emitter layer in the vertical direction and a main direction of pump radiation from the monolithically integrated pump radiation source is lateral;
   a conductive layer provided between the vertical emitter layer and the pump layer, the semiconductor laser device being partially ablated so that the conductive layer is partially exposed;
   a contact applied on the side of the semiconductor laser device which is closer to the pump layer than to the conductive layer;
   a further contact applied to exposed areas of the conductive layer; and
   a layer which is conductive and which is transparent for radiation of a wavelength as generated by the monolithically integrated pump radiation source provided between the conductive layer and the further contact;
   whereby an electrical field can be applied between the conductive layer and the contact for generating pump radiation by charge carrier injection.

2. The semiconductor laser device as claimed in claim 1, wherein the semiconductor laser device is ablated in the form of parallel trenches.

3. The semiconductor laser device as claimed in claim 1, wherein an etch stop layer which is resistant to an etching process which is suitable for exposing the conductive layer is provided adjacently to the conductive layer.

4. The semiconductor laser device as claimed in claim 1, wherein the conductive layer is arranged in the vertical direction of the semiconductor device in such a manner that the conductive layer is located in a node of the radiation field in the resonator of the vertical emitter region.

5. The semiconductor laser device as claimed in claim 1, wherein a vertical waveguide structure is provided between the vertical emitter layer and the conductive layer.

6. The semiconductor laser device as claimed in claim 5, wherein the vertical waveguide structure has a different index of refraction in the region in which it is located between the contact and the further contact, seen laterally, than in the region in which it is not located between the contact and the further contact.

7. The semiconductor laser device as claimed in claim 6, wherein the vertical waveguide structure is oxidized in the region in which it is located between the contact and the further contact, seen laterally.

8. The semiconductor laser device as claimed in claim 1, wherein the pump layer and the vertical emitter layer are followed in the vertical direction by an internal cavity reflective structure.

9. The semiconductor laser device as claimed in claim 8, wherein the internal cavity reflective structure is a Bragg reflector structure.

10. The semiconductor laser device as claimed in claim 8, wherein the internal cavity reflective structure is arranged between the vertical emitter layer and a substrate and the radiation generated by the vertical emitter layer is launched on the side opposite the substrate.

11. The semiconductor laser device as claimed in claim 1, wherein the vertical emitter layer is associated with an external resonator reflector which, together with the internal cavity reflective structure, forms the resonator for the vertical emitter region.

12. The semiconductor laser device as claimed in claim 11, wherein beam-shaping elements are arranged in the resonator.

13. The semiconductor laser device as claimed in claim 11, wherein frequency-selective elements are arranged in the resonator.

14. The semiconductor laser device as claimed in claim 11, wherein frequency-converting elements are arranged in the resonator.

15. The semiconductor laser device as claimed in claim 1, wherein at least one of the vertical emitter layer and the pump layer in each case have one or more quantum well structures.

16. The semiconductor laser device as claimed in claim 15, wherein the quantum well structures contain at least one of quantum troughs, quantum wires and quantum dots.

* * * * *